US011556769B2

(12) United States Patent
Wynn

(10) Patent No.: US 11,556,769 B2
(45) Date of Patent: Jan. 17, 2023

(54) SUPERCONDUCTING PARAMETRIC AMPLIFIER NEURAL NETWORK

(71) Applicant: Massachusetts Institute of Technology, Cambridge, MA (US)

(72) Inventor: Alexander Wynn, Carlisle, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 379 days.

(21) Appl. No.: 16/860,324

(22) Filed: Apr. 28, 2020

(65) Prior Publication Data

US 2020/0342296 A1 Oct. 29, 2020

Related U.S. Application Data

(60) Provisional application No. 62/839,885, filed on Apr. 29, 2019.

(51) Int. Cl.
| | | |
|---|---|---|
| *G06F 17/00* | (2019.01) | |
| *G06N 3/063* | (2006.01) | |
| *G06N 10/00* | (2022.01) | |
| *G06N 3/04* | (2006.01) | |
| *H03K 19/195* | (2006.01) | |

(52) U.S. Cl.
CPC ............... *G06N 3/063* (2013.01); *G06N 3/04* (2013.01); *G06N 10/00* (2019.01); *H03K 19/1954* (2013.01)

(58) Field of Classification Search
CPC ..... G06N 3/063; G06N 10/00; H03K 19/1954
See application file for complete search history.

(56) References Cited

U.S. PATENT DOCUMENTS

| 5,111,082 A | 5/1992 | Harada |
| 5,568,414 A | 10/1996 | Murai |
| 8,035,540 B2 | 10/2011 | Berkley et al. |

(Continued)

FOREIGN PATENT DOCUMENTS

| JP | 2694778 | * | 9/1997 | ............... G06G 7/60 |
| JP | 2739781 | * | 1/1998 | ........... H03K 19/195 |

OTHER PUBLICATIONS

International Preliminary Report on Patentability dated Nov. 2, 2021 for PCT Application No. PCT/US2020/030220; 6 Pages.

(Continued)

*Primary Examiner* — Cheng Yuan Tseng
(74) *Attorney, Agent, or Firm* — Daly, Crowley, Mofford & Durkee, LLP

(57) ABSTRACT

In some embodiments, a superconducting parametric amplification neural network (SPANN) includes neurons that operate in the analog domain, and a fanout network coupling the neurons that operates in the digital domain. Each neuron is provided one or more input currents having a resolution of several bits. The neuron weights the currents, sums the weighted currents with an optional bias or threshold current, then applies a nonlinear activation function to the result. The nonlinear function is implemented using a quantum flux parametron (QFP), thereby simultaneously amplifying and digitizing the output current signal. The digitized output of some or all neurons in each layer is provided to the next layer using a fanout network that operates to preserve the digital information held in the current.

14 Claims, 6 Drawing Sheets

(56) References Cited

U.S. PATENT DOCUMENTS

| | | | |
|---|---|---|---|
| 8,402,540 B2 * | 3/2013 | Kapoor | G06N 3/0472 709/224 |
| 9,000,805 B2 | 4/2015 | Chang et al. | |
| 9,379,546 B2 | 6/2016 | Li | |
| 9,473,124 B1 | 10/2016 | Mukhanov | |

OTHER PUBLICATIONS

PCT International Search Report and Written Opinion dated Jul. 8, 2020 for International Application No. PCT/US2020/030220; 9 Pages.

Buckley, et al., "Design of Superconducting Optoelectronic Networks for Neuromorphic Computing;" IEEE International Conference on Rebooting Computing (ICRC 2018); Nov. 2018; retrieved from https://www.osti.gov/servlets/purl/1494874; 8 Pages.

Chiarello, et al., "Artificial Neural Network Based on SQUIDs: Demonstration of Network Training and Operation;" Superconductor Science and Technology, vol. 26; Oct. 18, 2013; 7 Pages.

Katayama, et al., "Theoretical Basis of SQUID-based Artificial Neurons;" Journal of Applied Physics, vol. 124; Sep. 25, 2018; 6 Pages.

Klenov, et al., "Energy Efficient Superconducting Neural Networks for High-Speed Intellectual Data Processing Systems;" IEEE Transactions on Applied Superconductivity, vol. 28, No. 7; Oct. 2018; 6 Pages.

Soloviev, et al., "Adiabatic Superconducting Artificial Neural Network: Basic Cells;" Journal of Applied Physics, vol. 124; Sep. 26, 2018; 6 Pages.

* cited by examiner

SUPERCONDUCTING PARAMETRIC AMPLIFIER NEURAL NETWORK

CROSS-REFERENCE TO RELATED APPLICATIONS

This application claims the benefit under 35 U.S.C. § 119 of provisional patent application No. 62/839,885 filed Apr. 29, 2019, which is hereby incorporated by reference herein in its entirety.

STATEMENT REGARDING FEDERALLY SPONSORED RESEARCH

This invention was made with Government support under Grant No. FA8702-15-D-0001 awarded by the U.S. Air Force. The Government has certain rights in the invention.

FIELD

The disclosure pertains generally to artificial neural networks (ANNs), and more particularly to superconducting parametric amplifier neural networks (SPANNs).

BACKGROUND

Referring to FIG. 1, a prior art unit cell 100, commonly referred to as a "neuron", may be provided within an artificial neural network (ANN). An ANN can be composed of one or more (often many) layers of such neurons, the outputs of each layer being the inputs of the following layer. A neuron 100 can produce a single output 150 that is a nonlinear function of a weighted sum of one or more inputs. The neuron 100 of FIG. 1 is depicted as having three inputs 111, 112, 113, but in general any number of inputs may be used, with more inputs giving rise to greater computational complexity in the ANN. Thus, the neuron 100 has three primary, functional components: weighting components 121, 122, and 123 for applying (multiplicative) weights to the respective inputs 111, 112, 113; a summing component 130 for summing the weighted inputs to form the weighted sum; and the nonlinear function 140 itself, sometimes called an "activation function" following neurobiological terminology. The summing component 130 may further include a biasing or thresholding input 124 in the weighted sum to shift or scale the input to the nonlinear function 140.

Performance of ANNs implemented in software is often limited by the amount of processing power available, and in particular by the availability of CPU cycles. Given the large computational complexity achievable in ANNs, response times may run into the milliseconds, which is too slow for many practical applications such as classification of objects in real-time image processing systems. Also, incorporating extraneous hardware components such as a CPU entails many software ANN systems consuming copious amounts of electrical power. Thus, there has been a recent desire to implement ANNs using hardware, including memristors, application-specific integrated circuits (ASICs), and, as relevant to this disclosure, superconducting classical and quantum computers.

An ANN implemented in physical hardware using analog information encoding, typically multi-level voltages, is commonly known as a physical neural network (PNN). PNNs may offer practical advantages, in that power consumption may be lower and computational speed may be greatly increased. However, PNNs present challenges in that analog processes operate on values like currents, voltages, and so on that lack digital precision and the associated advantages of error correction and suppression. Such values, when carrying computational information, are liable to much higher signal degradation between layers in a PNN. Moreover, a PNN typically has a high fanout between layers, connecting potentially hundreds or thousands of neurons in each layer to the hundreds or thousands of neurons in another layer. When high fanout is present, many commonly-used activation functions, such as the sigmoid function, have a mathematical shape that produces additional information loss.

SUMMARY

Disclosed embodiments reduce or eliminate intra-layer signal degradation in a PNN by computing in the analog domain within neurons, while performing fanout between neuron layers in the digital domain. Digital-to-analog conversion is performed at the input of a neuron, while the analog-to-digital conversion is performed at the output of the neuron using a quantum flux parametron (QFP). According to embodiments, the activation function provided by a QFP in each neuronal unit cell provides a digitized output signal (e.g. a current) whose magnitude is already amplified to exist within a given desired range and have a desired precision for carrying information (e.g. to equal or approximate $\pm 1$ in appropriate units). This output signal then may be split according to a high fanout without loss of information using known digital signal techniques. Advantageously, the use of digital components between the layers allows for high connectivity between neurons with dramatically reduced requirements for crosstalk and inductance control in fanout wiring. Additionally, the use of superconducting elements in conjuncture with information encoded as currents allows for high computational energy efficiency, due to a lack of static power dissipation or joule heating during operation.

Thus, according to one aspect of the present disclosure, a neuron may be provided for use in a superconducting parametric amplification neural network (SPANN). The neuron can be coupled to a plurality of inputs, the input carrying respective currents. The neuron can include: for each input in the plurality of inputs, a corresponding weighting element for weighting the respective input current; a juncture at which the weighted currents combine to form a combined current; and a circuit for applying a nonlinear function to the combined current to provide a digitized output of the neuron.

In some embodiments, a weighting element can include an inductor. In some embodiments, a weighting element can have a variable inductance. In some embodiments, the neuron can include a circuit for adding a threshold current to the combined current. In some embodiments, the circuit for applying the nonlinear function can include a superconducting quantum flux parametron (QFP) circuit. In some embodiments, the circuit for applying the nonlinear function may be configure to generate a positive digital output if the combined current is greater than a threshold current value and to generate a negative digital output if the combined current is less than the threshold current value. In some embodiments, the circuit for applying a nonlinear function can be coupled to a computer clock signal via mutual inductance to power the digitized output.

According to another aspect of the present disclosure, a superconducting parametric amplification neural network (SPANN) comprising a plurality of the aforementioned neurons, with at least one of the neurons being coupled to a plurality of inputs carrying respective currents.

BRIEF DESCRIPTION OF THE DRAWINGS

The manner of making and using the disclosed subject matter may be appreciated by reference to the detailed description in connection with the drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

Figure 1:
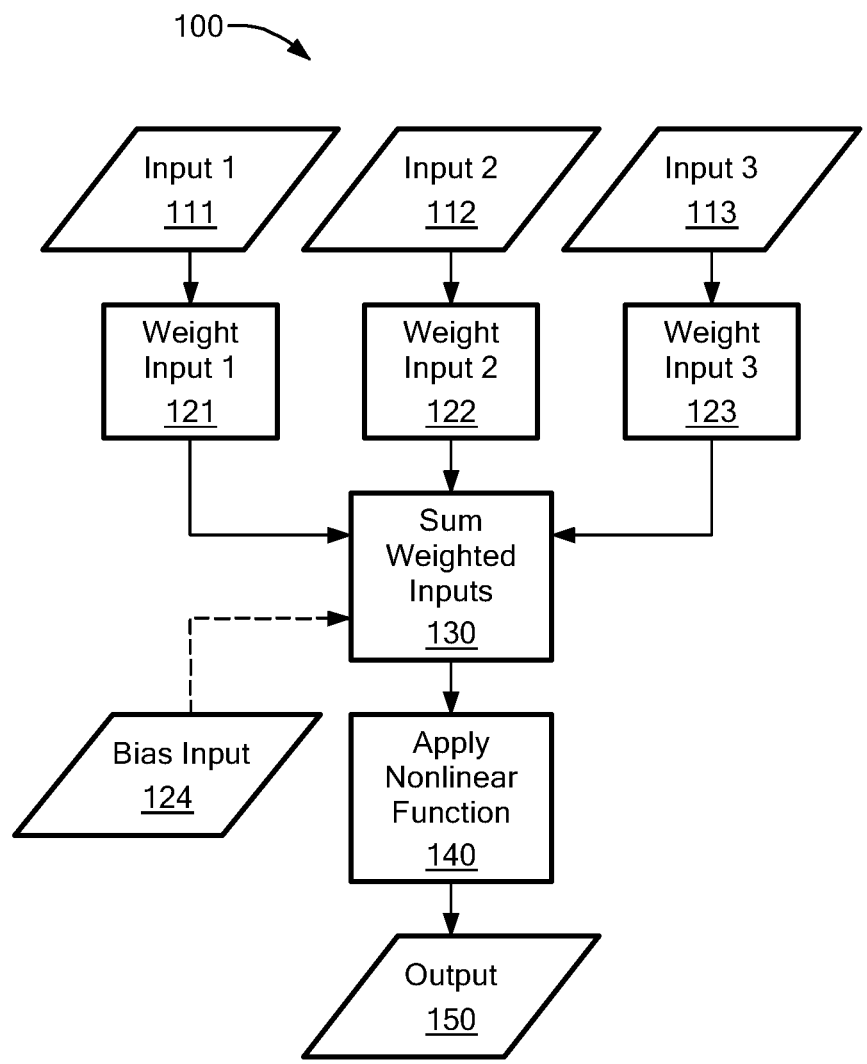
FIG. 1 is a block diagram showing a prior art unit cell ("neuron") that may be provided in an artificial neural network (ANN).
Figure 2:
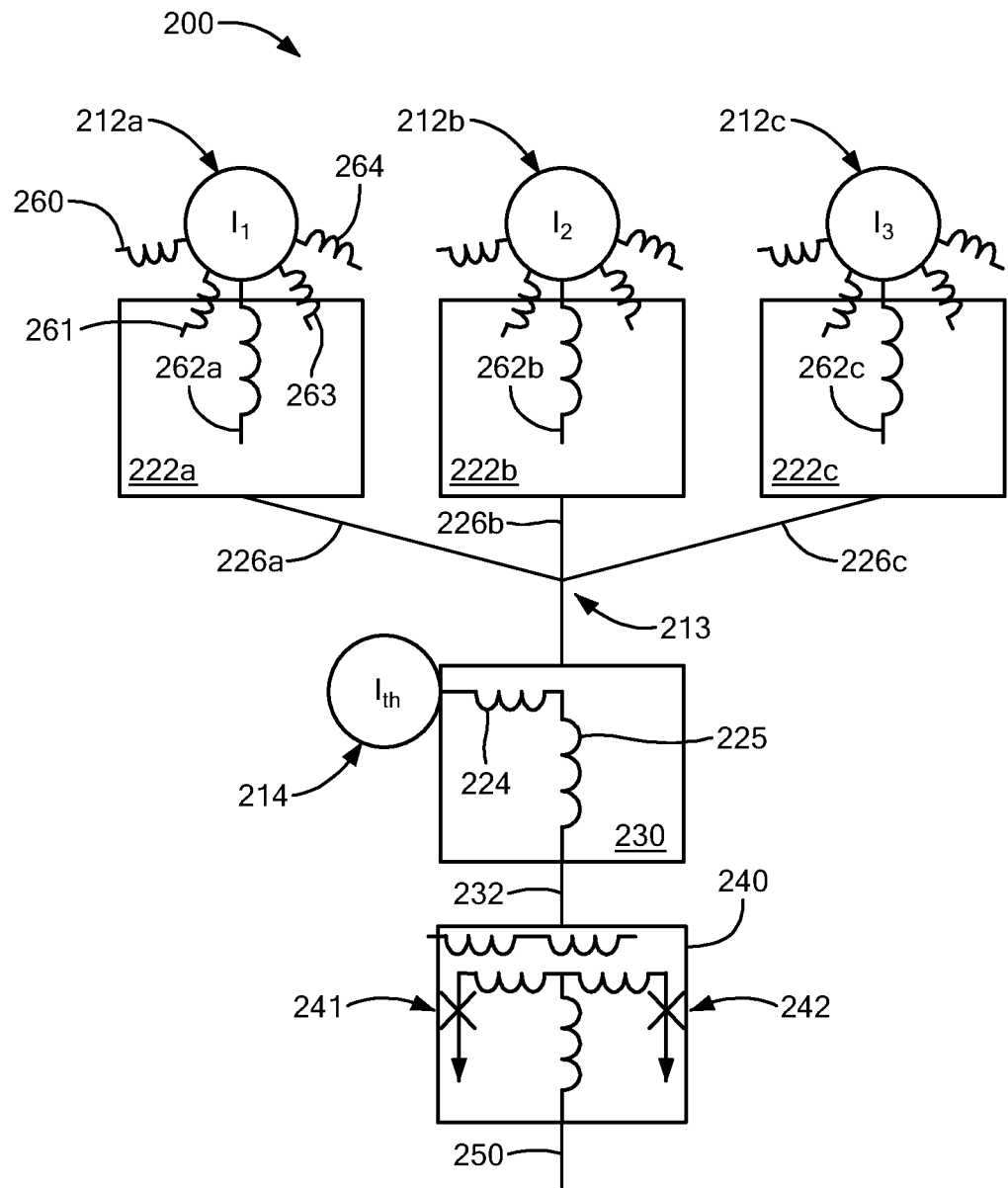
FIG. 2 is a block diagram showing a neuron that may form part of a superconducting parametric amplification neural network (SPANN), according to some embodiments.

FIG. 2 shows an example of a neuron 200 that may form a part of a superconducting parametric amplification neural network (SPANN), according to some embodiments. The neuron 200 can operate in three stages. In a first stage, a number of input currents $(I_1)$ 212a, $(I_2)$ 212b, $(I_3)$ 212c, etc. (212 generally) arrive at the neuron 200, and weights are applied. While three input currents 212a, 212b, 212c are shown in the example of FIG. 2, other numbers of inputs currents can be used. In a second stage, the weighted currents are summed, e.g. by joining wires at a juncture 213. Also in the second stage, a bias or threshold current $(I_{th})$ 214 may be summed to adjust the eventual output current to be either positive or negative. In a third stage, a nonlinear output function (i.e. an activation function) is applied to the weighted sum—as indicated by box 240—to produce an output current 250. Structures and techniques for performing these operations are described in more detail below.

It is appreciated that a SPANN comprising one or more neurons 100 may operate upon a digital input signal received from conventional computing hardware that is not shown. The digital input signal may be represented with a certain number of bits of precision and may be embodied in a voltage whose range is divided into an appropriate number of values encoding those bits. Such an input voltage may be converted to a current, without loss of precision, for presentation to the inputs of a first layer of SPANN neurons as disclosed herein. This conversion may be accomplished by tapping, at appropriate locations, a ladder of tuned resistors, as is known in the art. That is, input currents 212 shown in FIG. 2 can correspond to currents obtained from a resistor ladder in response to a digital input voltage signal.

Each of the input currents 212 are shown with a plurality of inductors to illustrate fanout from the previous layer of the SPANN. For example, input current 212a is shown with inductors 260, 261, 262a, 263, and 265, with inductor 262a corresponding to an input of neuron 200 and whereby the remaining inductors 260, 261, 263, and 264 may correspond to inputs of other neurons in the SPANN not shown in FIG. 2. It is appreciated that fanout may be accomplished using other circuitry (including circuitry to reduce intra-layer signal loss) such as discussed below in the context of FIG. 6.

Figure 3:
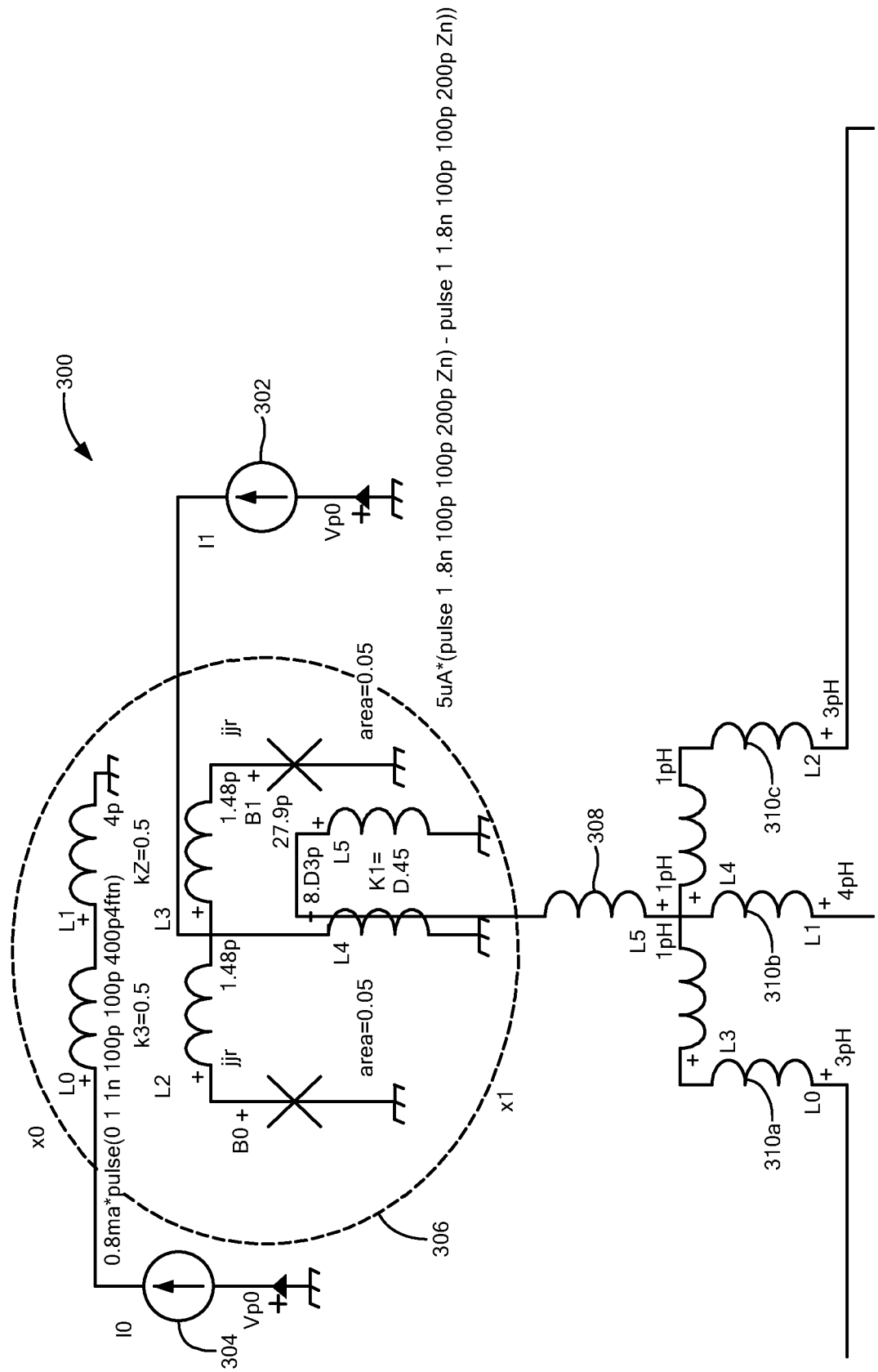
FIG. 3 is a schematic diagram showing a circuit for providing equally weighted inputs to three neurons in a SPANN, according to some embodiments, according to some embodiments.

Each input current 212a, 212b, 212c, etc. may be weighted by a corresponding weighting circuit 222a, 222b, 222c, etc. (222 generally). Weighting circuits 222a, 222b, 222c, etc. may produce respective weighted inputs 226a, 226b, 226c, etc. (226 generally), as shown. Weighting circuits 222a, 222b, 222c, etc. can include respective weighting elements 262a, 262b, 262c, etc. (262 generally) to apply the desired weights. The weighting elements 262 can be provided as variable or tunable inductors. In some embodiments, a weighting element 262 can include multiple physical circuit elements such as Josephson junctions, DC-SQUIDs, RF-SQUIDs, inductors, resistors, capacitors, and transistors. In some embodiments, the weights may be applied in the analog domain using current-branching in a network of superconducting inductors, such as illustrated in FIG. 3. The particular weights applied to each input current 212 may be selected using conventional techniques, as is known in ANNs. Illustrative circuitry for setting the weights themselves is described below in connection with FIG. 5. In some embodiments, weighting may be applied in the first stage using wire traces that are short relative to wire traces used in a digital ANN.

Figure 5:
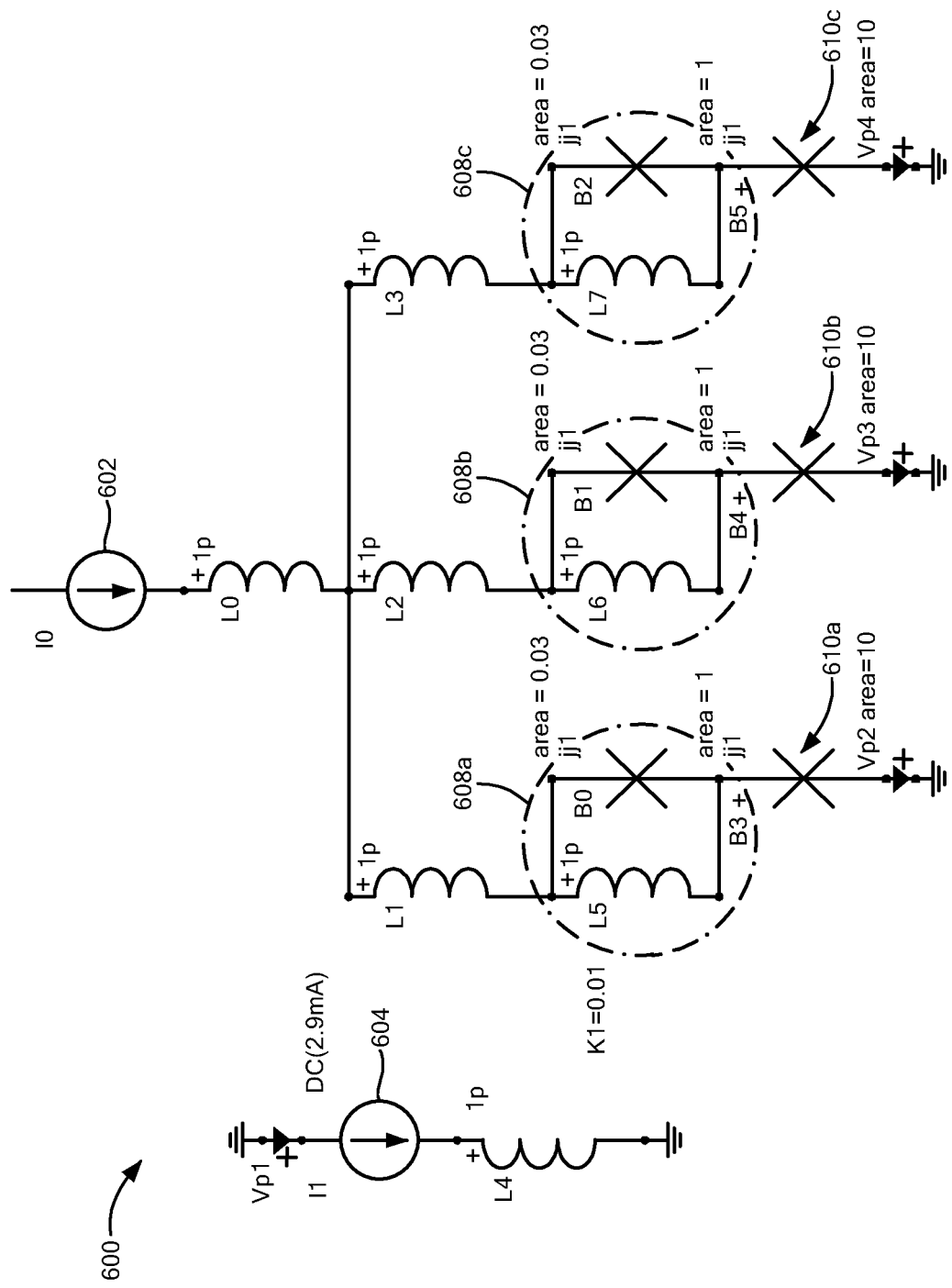
FIG. 5 is a schematic diagram showing a network for tuning the input weights in a SPANN, according to some embodiments.

For example, to increase chip density, wire traces on the order of 1 to 10 micrometers, or about 1 to 10 pH, can be used. While such short wire traces may be desirable in some applications, weighting elements can have larger wire traces in some embodiments. For example, as previously mentioned, a weighting element can include Josephson junctions, DC-SQUIDs, RF-SQUIDs, etc. For example, FIG. 5 shows the use of an RF-SQUID based circuit to provide a reprogrammable/tunable weight, wherein the RF-SQUID can include a Josephson junction and a parallel inductor.

Advantageously, in terms of computational requirements, the first stage of the disclosed SPANN is inexpensive relative to the corresponding function in a digital ANN. A gain in operational speed in the disclosed SPANN (e.g., of approximately 3 orders of magnitude) can be obtained since weighting is performed in the analog domain by locally dividing currents using relatively short wire traces, or other analog or asynchronous weighting elements such as those illustrated in FIG. 5, rather than by performing a digital computation in a CPU or ALU remote from the input. In particular, current from the $i^{th}$ input splits in proportion to $1/L_i$, where $L_i$ is the inductance of a weighting inductance for that input. Moreover, a reduction in power consumption per multiply operation occurs due to use of superconducting currents.

In the second stage, the weighted inputs 226 can be summed by converging inductance branches to a single line, as indicated by junction 213. Since the computational information is carried by current magnitude, summing in the second stage may be implemented simply by joining the weighted input lines at a circuit juncture. As with the first stage, this design provides advantages over digital ANNs in both increased speed and reduced power consumption as no separate summation computation is required.

In some embodiments, the neuron 200 can include a circuit 230 for weighting a threshold or bias current 214 and adding the weighted threshold current to the sum of the weighted inputs 222. The circuit 230 can include an inductor 224 to weight the threshold current 214, wherein the inductor 224 is coupled to the circuit juncture 213, as shown in FIG. 2. The threshold current 214 may be provided, for example, from a current source. The illustrative circuit 230 can also include a second conductor 225 that carries the summed currents from 214 and 213 and may serve to smooth transient currents. In other embodiments, the second conductor 225 can be omitted or configured to have zero inductance. In some embodiments, the circuit 230 may be the same as or similar to circuitry shown and described in the context of FIG. 4.

In the third stage, a nonlinear activation function can be applied using a circuit 240. That is, circuit 240 can receive a weighted sum of currents 232 from circuit 230 and apply a nonlinear function to generate an output current 250. In some embodiments, circuit 240 can be provided as a quantum flux parametron (QFP). As is known in the art, a QFP is a type of nonlinear amplifier—the nonlinearity derives from the use of Josephson junctures 241, 242 (indicated as the X's in circuit 240). In particular, if the weighted sum of currents 232 is greater than a threshold current value (e.g., zero), then a positive output current 250 may be generated. Similarly, if the weighted sum of currents 232 is less than the threshold current value (e.g., less than zero, meaning it has a reverse direction), then a negative output current 250 may be generated. The amplification properties of the QFP re-digitize the information-carrying current signal, advantageously preventing analog errors from accumulating through multiple layers.

In some embodiments, circuit 240 can be coupled to a recurring computer clock signal via mutual inductance to power (or "drive") the output current. It is appreciated that this can result in power saving since the power to drive the output current comes from the clock signal itself, with no static power dissipation. In some embodiments, the circuit 240 may be the same as or similar to circuitry shown and described in the context of FIG. 4.

It is appreciated that the values of the input weights applied by circuits 222 may be critical to operation of the SPANN for an intended purpose. To that end, the weighting elements 262 may be variable or tunable inductors, and may be set using an auxiliary network of inductors. In some embodiments, the SPANN may be modeled and trained offline, using circuit modeling software. The result of the training is a set of values of each weight by which the input information is to be multiplied. From these values, relative inductances $L_i$ can be derived and implemented within circuits 222 to divide the input currents so as to appropriately reflect the desired weights. In other embodiments, the SPANN may be trained in situ by adding circuitry for computing error functions and for backpropagation to its design. An example of a network that can be used for setting weighting inductances is shown in FIG. 5.

Referring to FIG. 3, an illustrative circuit 300 can be used for weighting inputs to a SPANN, according to some embodiments. In this example, weights may be applied in the analog domain using current-branching in a network of superconducting inductors. Circuit 300 can include current sources 302 and 304 coupled to a QFP 306, a first conductor 308 coupled to the QFP 306, and one or more output inductors 310a, 310b, 310c, etc. (310 generally) coupled to the first conductor 308. In some embodiments, the output inductors 310 can be equally weighted. Whereas three output inductors 310 are shown in FIG. 3, other numbers of output inductors can be used. Circuit 300 may correspond an embodiment of a weighting circuit 222 shown in FIG. 2. For example, current across first conductor 308 may correspond to input current 212a of FIG. 2, and output inductors 310 of FIG. 3 may correspond to inductors 260, 261, 262a, 263 of FIG. 2.

It should be appreciated that the upper segment of circuit 300 (i.e., current sources 302, 304 and QFP 306) may correspond to the nonlinear function from a previous layer in the SPANN (essentially box 240 in FIG. 2). The illustrative circuit 300 takes a relatively small input current 302, amplifies or otherwise transforms it to digital value using a clock current 304, applying a nonlinear function to the current by way of QFP 306, resulting in an input current across first inductor 308. Thus, circuit 300 may be used for internal layers of a SPANN (i.e., layers other than the first layer). For the first layer, the input current can be provided by a current source, such as current source 302, connected directly to first inductor 308. That is, the other current source 304 and the QFP 306 can be omitted.

It is appreciated that the circuit of FIG. 3 is merely illustrative, and that other circuits may be used to alter input currents according to a desired weight.

Figure 4:
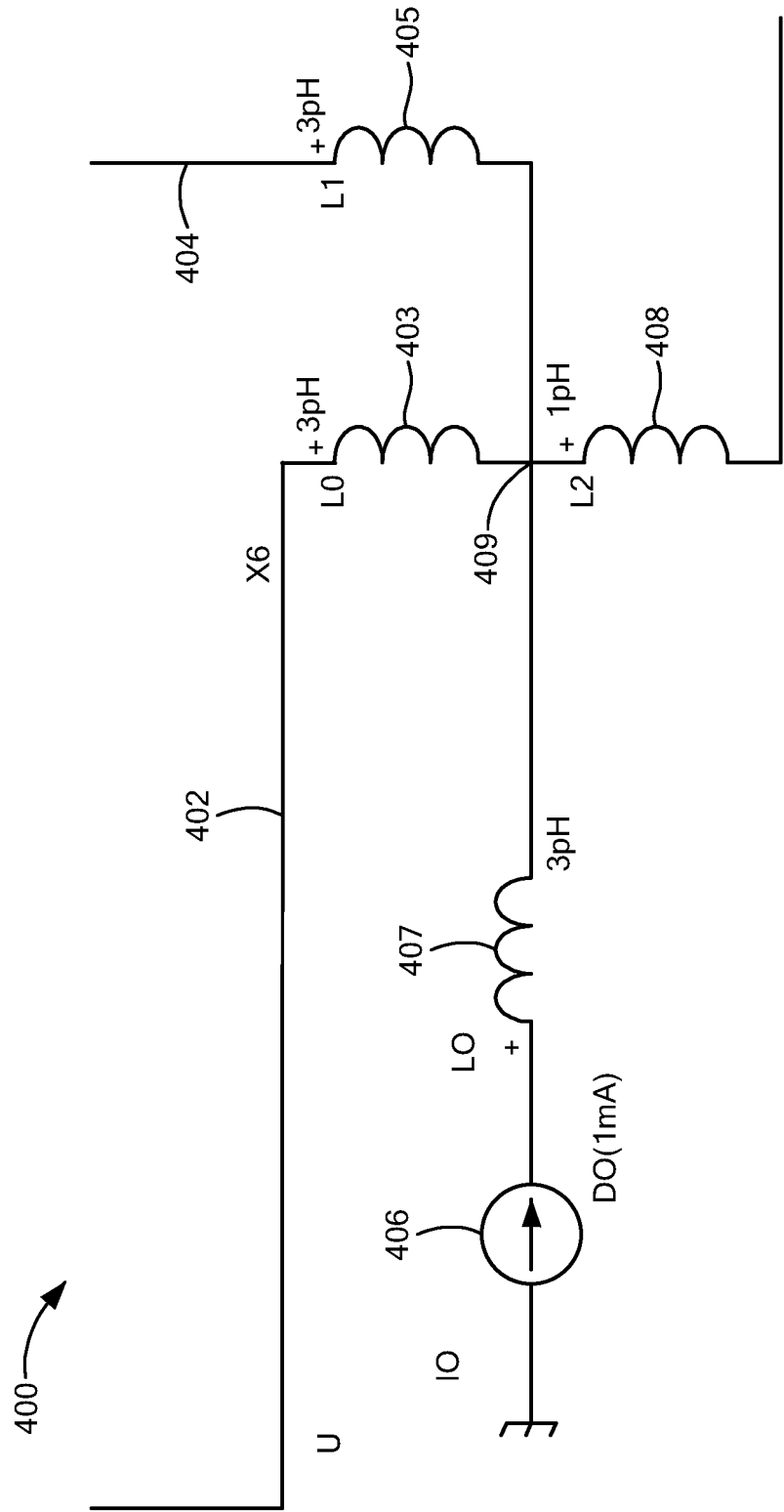
FIG. 4 is a schematic diagram showing a circuit for summing a bias current with the weighted inputs in a SPANN, according to some embodiments.

FIG. 4 shows a circuit 400 for summing a bias/threshold current with the weighted inputs in a SPANN embodiment. That is, circuit 400 may correspond to an embodiment of circuit 230 show in FIG. 2. In this embodiment, the circuit includes two inputs 402 and 404 connected to respective weighting inductors 403 and 405, and a threshold current input shown as a DC current source 406 connected to inductor 407. The inputs currents and threshold current may combine at node 409 to produce an output current crossing inductor 408. Inputs 402, 404 may be connected to the outputs of weighting elements from previous layers of the SPANN (e.g., from inductors 310 of FIG. 3).

It should be understood that, whereas FIG. 2 shows the junction of inputs 213 as being separate and apart from the bias weighting circuit 230, FIG. 4 shows the summing and biasing functions as provided by a single circuit 400. These functions can be separated with no change in the operation of the system. Moreover, whereas the circuit 400 of FIG. 4 is shown as having two inputs 402, 404, additional inputs can be likewise added and connected to node 409.

FIG. 5 shows an example of a network 600 for tuning the input weights (i.e., the inductors $L_i$) in a SPANN. The illustrative network 600 includes an input current source 602 connected to RF SQUIDs 608a, 608b, 608c (608 generally) via one or more inductors, as shown. The RF SQUIDs 608a, 608b, 608c are, in turn, connected to respective output loading elements 610a, 610b, 610c (610 generally), shown here as Josephson junctions. In some embodiments, output loading elements 610 can be provided as inductors or QFPs. Network 600 can be provided, for example, to tune the weights of inductors within circuits 222 of FIG. 2. For example, current source 602 may correspond to input current 212a in FIG. 2 and RF SQUIDs 608 may correspond to three of elements 260, 261, 262a, 263, and 264 of FIG. 2. As another example, a given RF SQUID (e.g., RF SQUID 608b) may correspond to weighting element 222a of FIG. 2. It is to be appreciated that FIG. 5 shows an example of weighting elements that are not single fixed inductors, but rather are comprised of multiple elements which may provide a tunable/variable inductance. As shown, network 600 can include an additional current source 604 that allows for tuning an inductance of 608a in relation to 608b and 608c.

The inductance values to be set by network 600 may be derived from any training process known in the art, which may be application-specific (e.g. classification). Tunable inductors may be implemented, for example, using a radio-frequency (RF) superconducting quantum interference devices (SQUIDs) coupled to a flux bias.

In some embodiments, current source 604 can be replaced by a current source storing multiple magnetic flux quanta in a ring. Here, if the coupling inductor that provides the flux bias is connected to a multi-fluxon storage loop with a storage capacity of N fluxons, then the desired number of fluxons in the storage loop can be loaded by inductive coupling-induced switching of a Josephson junction in the storage loop, or by direct injection using, e.g., single flux quantum (SFQ) logic to provide a digitally programmable dynamic range of 1:N. In some embodiments, tunable resistive branches could be used, e.g. through gated transistors or voltage-biased, direct-current (DC) SQUIDs.

Figure 6:
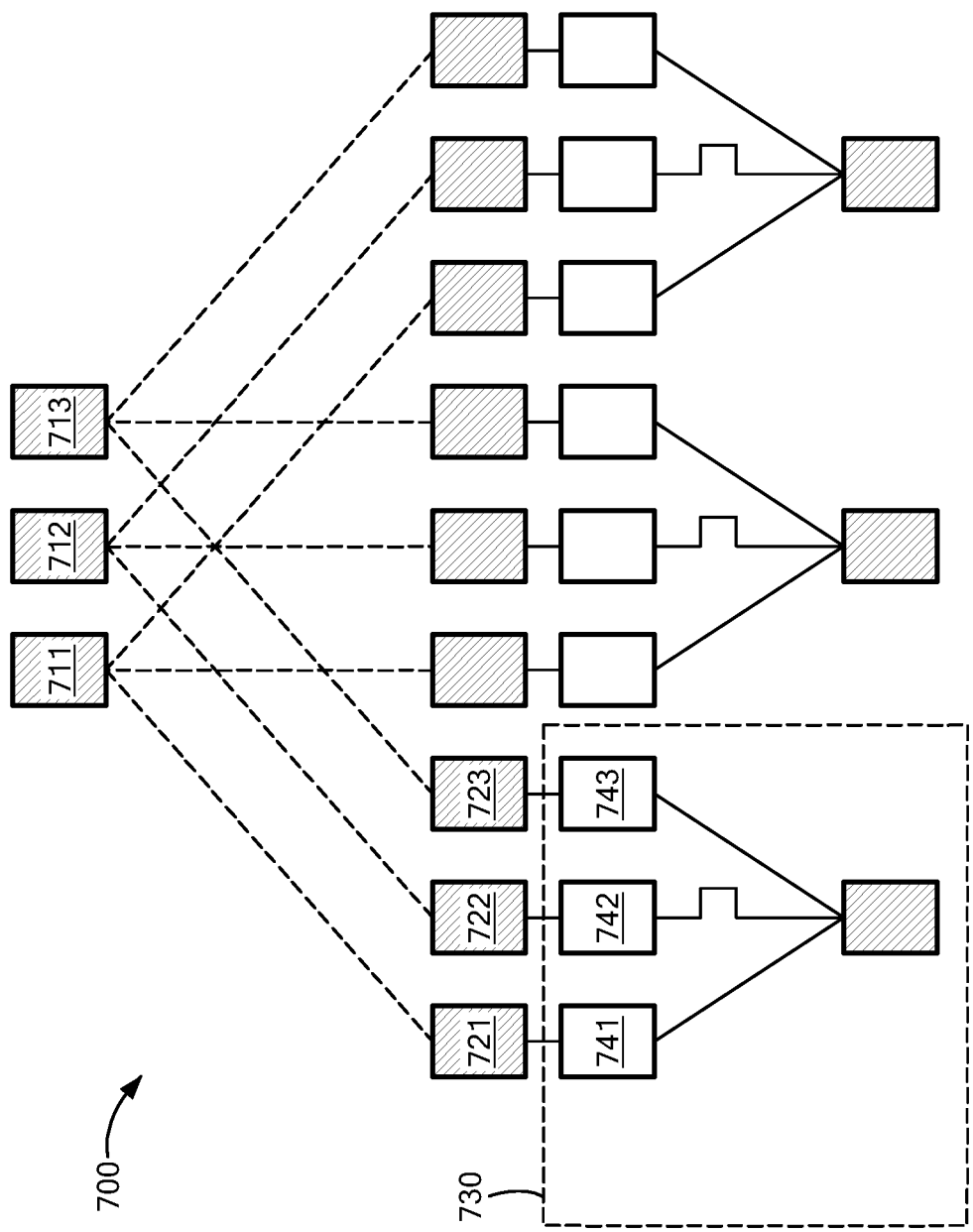
FIG. 6 is a block diagram showing intra-layer fanout between different layers in a SPANN, according to some embodiments.

FIG. 6 illustrates intra-layer fanout 700 in a SPANN between two layers, each having three neurons. Thus, three neurons in a first layer have outputs 711, 712, 713. The current at these outputs 711, 712, 713 is digitally encoded as described above, split three ways, and provided to each neuron in a second layer, such as neuron 730. To facilitate the splitting of the current without loss of digital information, circuitry may be provided such as digital fanout circuitry 721, 722, 723.

The current outputs of the digital fanout circuitry 721, 722, 723 are then provided as three inputs to the neuron 730. In particular, the output from circuitry 721 represents the current output 711, and is weighted by weighting circuit 741; the output from circuitry 722 represents the current output 712, and is weighted by weighting circuit 742; and the output from circuitry 723 represents the current output 713, and is weighted by weighting circuit 743. It is appreciated that FIG. 6 is merely illustrative, and similar structures as in the first stage may be repeated for each input current in a SPANN neuron having more or fewer inputs than shown. As described above, the weighted current outputs of circuits 741, 742, and 743 can then be summed in the summation circuitry 750 of neuron 730.

It should be appreciated that FIG. 6 does not show various portions of the neurons in the first and second layers, such as the inputs to, and summation circuit for, the three neurons in the first layer, and the outputs for the three neurons in the second layer (of which neuron 730 is one).

A tradeoff exists between smaller-scale embodiments which are faster, and larger-scale embodiments which allow greater flexibility for re-training to new problem sets. It is appreciated that a person having ordinary skill in the art will understand how to design a SPANN according to the concepts, techniques, and structures disclosed herein to balance these advantages in the context of a particular use or application.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

The invention claimed is:

1. A neuron in a superconducting parametric amplification neural network (SPANN), the neuron being coupled to a plurality of inputs carrying respective currents, the neuron comprising:
    for each input in the plurality of inputs, a corresponding weighting inductor for weighting the respective input current, the weighting inductor being in direct connection with the input;
    a juncture at which the weighted currents combine to form a combined current as a weighted sum of the input currents;
    a circuit for applying a nonlinear function to the combined current to provide a digitized output of the neuron; and
    an output inductor directly connected to the circuit for applying a nonlinear function and to a parallel network of other inductors corresponding to weighting inductors of other neurons in the SPANN.

2. The neuron of claim 1, wherein the weighting inductors for weighting the respective input currents have variable inductance.

3. The neuron of claim 1, further comprising a circuit for adding a threshold current to the combined current.

4. The neuron of claim 1, wherein the circuit for applying the nonlinear function includes a superconducting quantum flux parametron (QFP) circuit.

5. The neuron of claim 1, wherein the circuit for applying the nonlinear function is configured to generate a positive digital output if the combined current is greater than a threshold current value and to generate a negative digital output if the combined current is less than the threshold current value.

6. The neuron of claim 1, wherein the circuit for applying a nonlinear function is coupled to a computer clock signal via mutual inductance to power the digitized output.

7. A superconducting parametric amplification neural network (SPANN) comprising a plurality of neurons, at least one of the neurons being coupled to a plurality of inputs, the input carrying respective currents, the at least one of the neurons comprising:
    for each input in the plurality of inputs, a corresponding weighting inductor for weighting the respective input current, the weighting inductor being in direct connection with the input;
    a juncture at which the weighted currents combine to form a combined current as a weighted sum of the input currents;
    a circuit for applying a nonlinear function to the combined current to provide a digitized output of the neuron; and
    an output inductor directly connected to the circuit for applying a nonlinear function and to a parallel network of other inductors corresponding to weighting inductors of other ones of the plurality of neurons.

8. The SPANN of claim 7, wherein the weighting inductors for weighting the respective input currents have variable inductance.

9. The SPANN of claim 7, further comprising a circuit for adding a threshold current to the combined current.

10. The SPANN of claim 7, wherein the circuit for applying the nonlinear function includes a superconducting quantum flux parametron (QFP) circuit.

11. The SPANN of claim 7, wherein the circuit for applying the nonlinear function is configured to generate a positive digital output if the combined current is greater than a threshold current value and to generate a negative digital output if the combined current is less than the threshold current value.

12. The SPANN of claim 7, wherein the circuit for applying a nonlinear function is coupled to a computer clock signal via mutual inductance to power the digitized output.

13. The neuron of claim 1, wherein the output inductor is directly connected to weighting inductors of at least three other neurons in the SPANN.

14. The SPANN of claim 7, wherein the output inductor is directly connected to weighting inductors of at least three other neurons of the plurality of neurons.

* * * * *